(12) United States Patent
Liu

(10) Patent No.: US 8,770,925 B2
(45) Date of Patent: Jul. 8, 2014

(54) FAN MODULE AND AIR DUCT THEREOF

(75) Inventor: Lei Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 500 days.

(21) Appl. No.: 13/117,144

(22) Filed: May 27, 2011

(65) Prior Publication Data

US 2012/0275917 A1 Nov. 1, 2012

(30) Foreign Application Priority Data

Apr. 28, 2011 (CN) .......................... 2011 1 0108627

(51) Int. Cl.
 *F04D 29/54* (2006.01)
(52) U.S. Cl.
 USPC .......................................................... 415/148
(58) Field of Classification Search
 USPC ............... 361/617, 679.49, 695; 415/209.3, 415/211.2, 214.1, 220; 454/325, 304, 278, 454/281, 265, 267, 277, 309, 313, 314, 316, 454/184, 155
 See application file for complete search history.

(56) References Cited

U.S. PATENT DOCUMENTS

| | | | | | |
|---|---|---|---|---|---|
| 2,632,377 | A | * | 3/1953 | Mader | 454/349 |
| 2,793,580 | A | * | 5/1957 | Hope et al. | 454/351 |
| 3,173,478 | A | * | 3/1965 | Maycen | 165/121 |
| 5,277,658 | A | * | 1/1994 | Goettl | 454/259 |
| 5,316,423 | A | * | 5/1994 | Kin | 411/510 |
| 5,338,252 | A | * | 8/1994 | Bowler et al. | 454/155 |
| 6,113,487 | A | * | 9/2000 | Kim | 454/202 |
| 6,151,213 | A | * | 11/2000 | Ater et al. | 361/695 |
| 6,181,557 | B1 | * | 1/2001 | Gatti | 361/695 |
| 7,031,154 | B2 | * | 4/2006 | Bash et al. | 361/690 |
| 7,152,418 | B2 | * | 12/2006 | Alappat et al. | 62/186 |
| 7,193,849 | B2 | * | 3/2007 | Xu et al. | 361/695 |
| 7,535,709 | B2 | * | 5/2009 | Fan et al. | 361/695 |
| 7,583,501 | B2 | * | 9/2009 | Yamanaka | 361/695 |
| 7,656,664 | B2 | * | 2/2010 | Ye et al. | 361/695 |
| 8,007,228 | B2 | * | 8/2011 | Wang | 415/146 |
| 8,120,910 | B2 | * | 2/2012 | Hong | 361/695 |
| 8,248,794 | B2 | * | 8/2012 | Li et al. | 361/695 |
| 8,534,988 | B2 | * | 9/2013 | Zhang et al. | 415/26 |
| 2008/0112806 | A1 | * | 5/2008 | Fan et al. | 415/213.1 |
| 2010/0314569 | A1 | * | 12/2010 | Hildreth et al. | 251/212 |

* cited by examiner

*Primary Examiner* — Nathaniel Wiehe
*Assistant Examiner* — Eldon Brockman
(74) *Attorney, Agent, or Firm* — Novak Druce Connolly Bove + Quigg LLP

(57) ABSTRACT

A fan module includes a fan, and an air duct. The air duct includes a mounting bracket mounted to the fan, and a number of guiding plates pivotably mounted in the mounting bracket. Each guiding plate comprises a latching piece mounted to the guiding plate, The mounting bracket defines a number of groups of positioning holes, with each group of positioning holes corresponding to the latching piece of each guiding plate. The latching piece is selectively positioned by one of the corresponding group of positioning holes.

7 Claims, 5 Drawing Sheets

FAN MODULE AND AIR DUCT THEREOF

BACKGROUND

1. Technical Field

The present disclosure relates to a fan module with an air duct.

2. Description of Related Art

With the continuing development of electronic technology, electronic elements of an electronic device generate more heat during operation than previously. The heat needs to be dissipated as quickly as possible. A common method for dissipating the heat is to use a fan to generate airflow to dissipate the heat from the electronic elements. Furthermore, an air duct is often used to assist in heat dissipation. However, the airflow direction of a fan cannot be adjusted with the existing air ducts.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
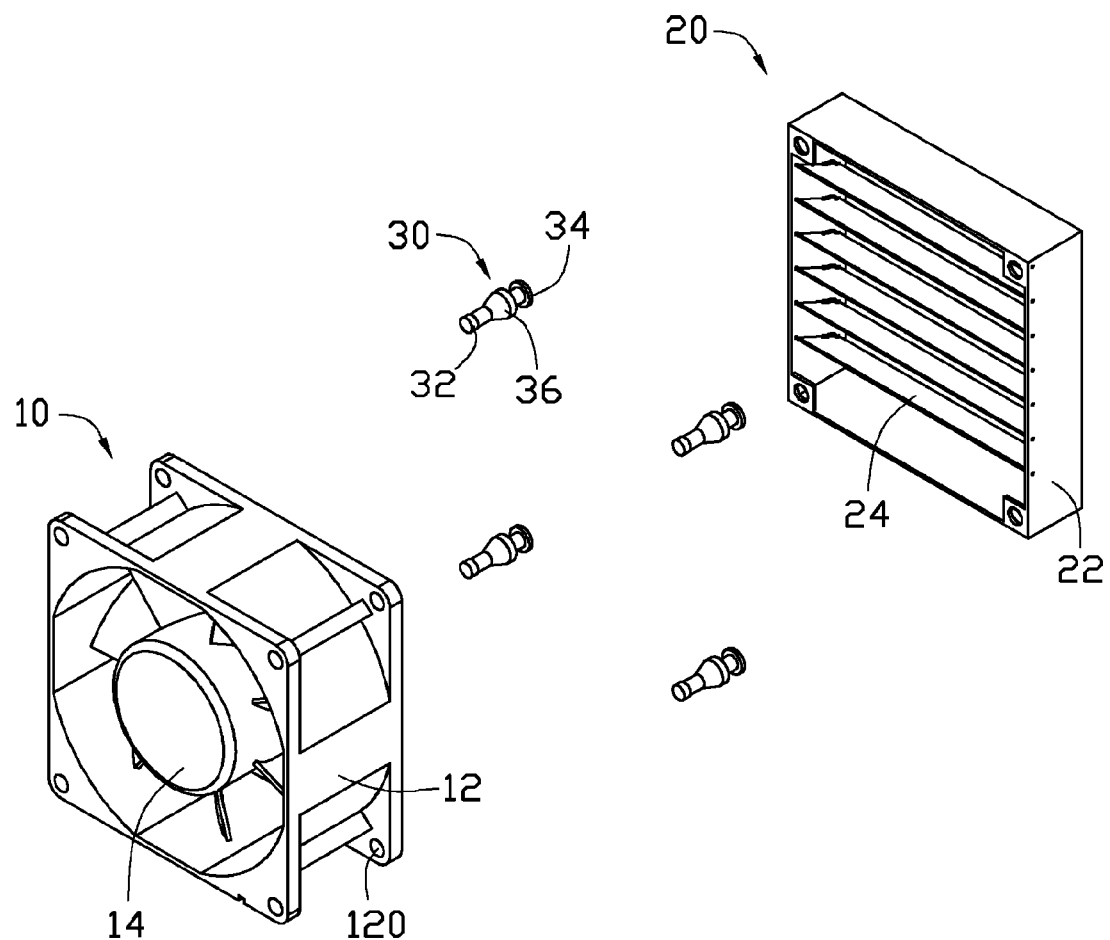
FIG. 1 is an exploded, isometric view of an exemplary embodiment of a fan module, the fan module includes an air duct.

Referring to FIG. 1, an exemplary embodiment of a fan module includes a fan 10, an air duct 20, and a plurality of fastening members 30.

The fan 10 includes a shell 12 and a plurality of blades 14 mounted in the shell 12. Four corners of a first side of the shell 12 and four corners of a second side of the shell 12 opposite to the first side each define a mounting hole 120.

Figure 2:
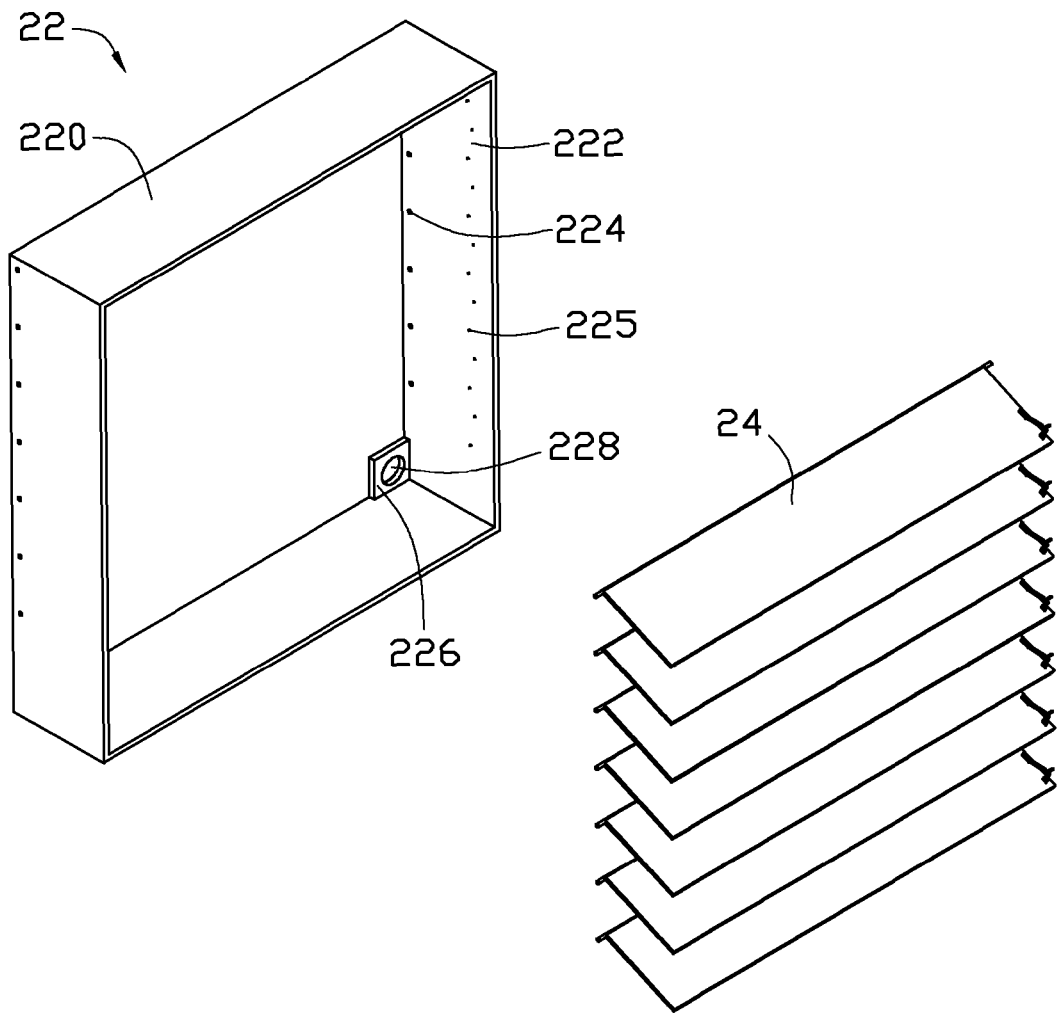
FIG. 2 is an exploded, isometric view of the air duct of FIG. 1, the air duct includes a plurality of guiding plate.
Figure 3:
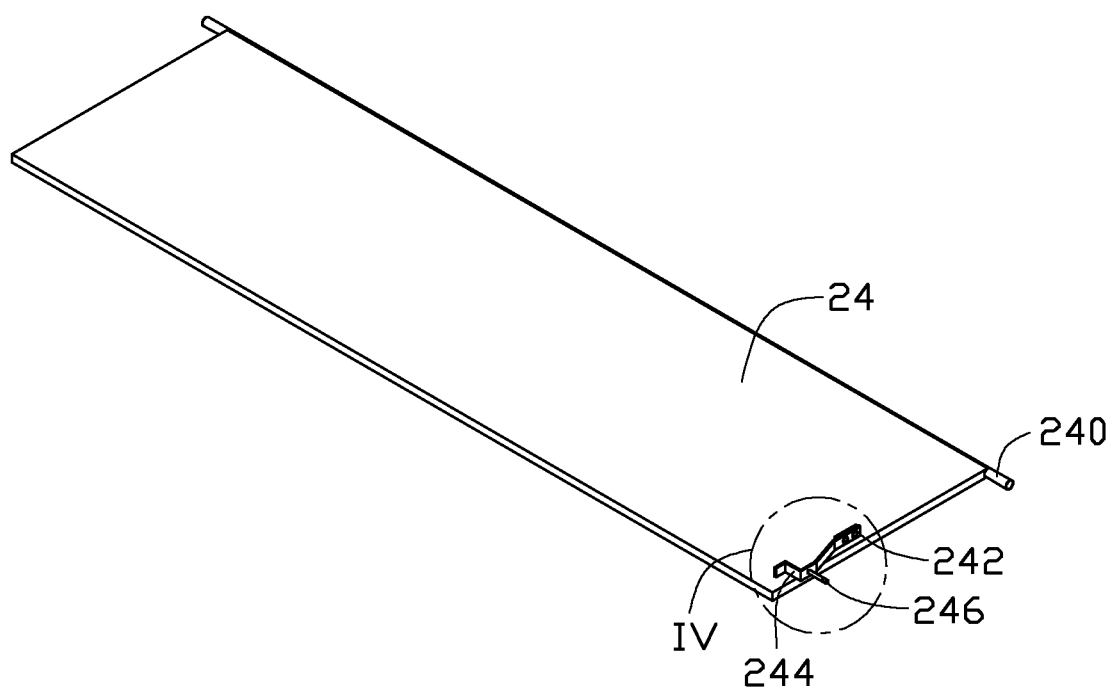
FIG. 3 is an enlarged, isometric view of one of the guiding plates of FIG. 2.
Figure 4:
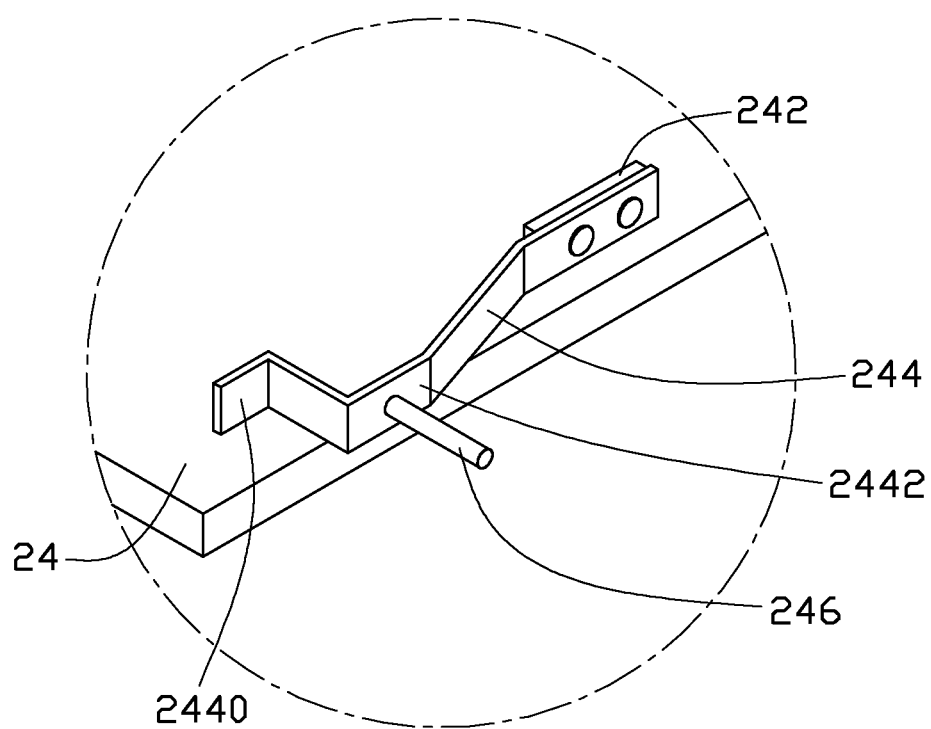
FIG. 4 is an enlarged view of the circled portion IV of FIG. 3.

Referring to FIGS. 2 to 4, the air duct 20 includes a substantially rectangular mounting bracket 22, and a plurality of guiding plates 24 pivotably mounted to the mounting bracket 22 like a shutter.

The mounting bracket 22 includes two first lateral plates 220 parallel to each other, and two second lateral plates 222 substantially perpendicularly connected between corresponding ends of the first lateral plates 220. The second lateral plates 222 each longitudinally define a plurality of pivot holes 224, adjacent to a first side of the lateral plate 22 and arranged in a row. One of the second lateral plates 222 defines a plurality of positioning holes 225 adjacent to a second side of the lateral plate 222 opposite to the first side, corresponding to each pivot hole 224 of the second lateral plate 222. Four mounting pieces 226 are formed on four corners of the mounting bracket 22, positioned at ends of the first sides of the lateral plates 222, respectively. Each mounting piece 226 defines a through hole 228.

Two pivot pins 240 extend from two opposite ends of a top side of each guiding plate 24. A mounting block 242 extends from an end of a bottom side of each guiding plate 24 opposite to the top side, located on an outer surface of the guiding plate 24. An elastic latching piece 244 is mounted to a bottom of each mounting block 242. An operation portion 2440 is formed at an extremity of each latching piece 244, opposite to the mounting block 242. A substantially U-shaped positioning portion 2442 is formed at a center of each latching piece 244. A positioning pin 246 extends from each positioning portion 2442, opposite to the mounting block 242.

Referring to FIG. 1 again, in this embodiment, each fastening member 30 is made of elastic material, such as plastic. The fastening member 30 includes a shaft 32, a coin-shaped fastening portion 34 extending from one end of the shaft 32, and a tapered flange 36 extending from a circumference of the shaft 32 adjacent to the fastening portion 34.

Figure 5:
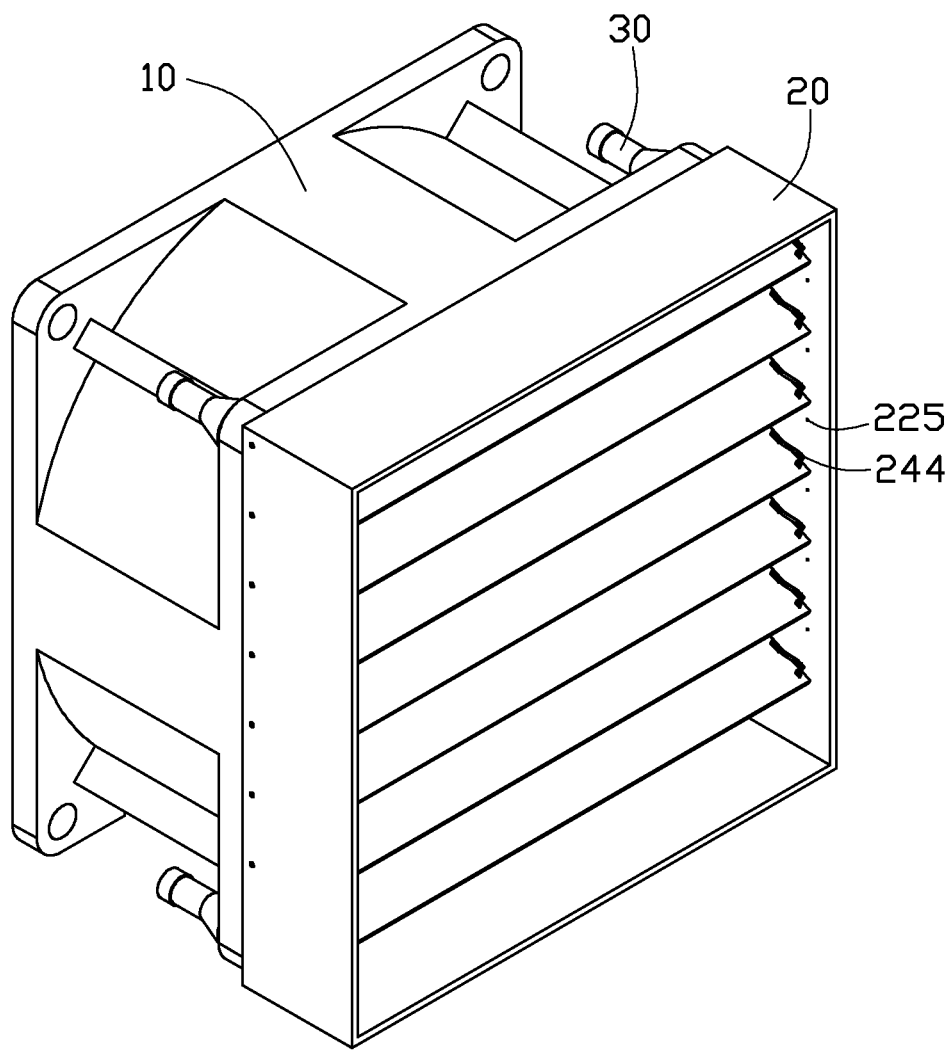
FIG. 5 is an assembled, isometric view of FIG. 1, but viewed from another perspective.

Referring to FIG. 5, in assembly, the pivot pins 240 of the guiding plates 24 are rotatably mounted in the pivot holes 224 of the second lateral plates 222. Thus, the guiding plates 24 are rotatably mounted to the mounting bracket 22, between the second lateral plates 222. The through holes 228 of the mounting bracket 22 are aligned with the mounting holes 120 of the second side of the shell 12. The shafts 32 with flanges 36 of the fastening members 30 extend through the through holes 228 and the mounting holes 120 of the second side of the shell 12, in that order. The fastening portions 34 of fastening members 30 resist against the mounting pieces 226, and the flanges 36 resist against the second side of the shell 12. Thereby, the air duct 20 is mounted to the fan 10.

In use, the guiding plates 24 are rotated to a predetermined angle according to actual need, the positioning pin 246 of each guiding plate 24 is selectively positioned in one of the plurality of positioning holes 225 to position the guiding plates 24. The positioning pin 246 can be positioned in different positioning holes 225, thereby the direction of the airflow from the fan 10 is adjustable.

It is believed that the present embodiment and its advantages will be understood from the foregoing description, and it will be apparent that various changes may be made thereto without departing from the spirit and scope of the description or sacrificing all of their material advantages, the example hereinbefore described merely being exemplary embodiment.

What is claimed is:

1. A fan module comprising:
   a fan; and
   an air duct comprising a mounting bracket mounted to the fan, and a plurality of guiding plates rotatably mounted to the mounting bracket;
   wherein each guiding plate comprises a latching piece mounted to the guiding plate, and the mounting bracket defines a plurality of groups of positioning holes, with each group of positioning holes corresponding to the latching piece of each guiding plate, and the latching piece is selectively positioned by one of the corresponding group of positioning holes;
   wherein the mounting bracket comprises two first lateral plates parallel to each other, and two second lateral plates substantially perpendicularly connected between corresponding ends of the first lateral plates, the second lateral plates each define a plurality of pivot holes adjacent to the fan, two pivot pins extend from two opposite ends of a top side of each guiding plate to be respectively and rotatably mounted in corresponding two of the pivot holes of the second lateral plates;

wherein the positioning holes are defined in one of the second lateral plates, the latching piece is mounted to an end of each guiding plate, adjacent to the corresponding one of the groups of positioning holes, a positioning pin extends from the latching piece to be selectively positioned in one of the positioning holes of the corresponding group; and wherein each latching piece is elastic, an operation portion is formed at an extremity of the latching piece, a positioning portion is formed at a center of the latching piece, the positioning pin extends from the positioning portion.

2. The fan module of claim 1, wherein the fan comprises a shell and a plurality of blades mounted in the shell, four corners of a side of the shell adjacent to the air duct each define a mounting hole, four mounting pieces are formed on four corners of the mounting bracket, adjacent to the fan, each mounting piece defines a through hole, a plurality of fastening members extends through the through holes of the mounting pieces and the mounting holes of the fan to mount the mounting bracket to the fan.

3. The fan module of claim 2, wherein each fastening member is made of elastic material, and comprises a shaft, a fastening portion extending from one end of the shaft, and a tapered flange extending from a circumference of the shaft, the shafts with the flanges of the fastening members extend through the through holes of the mounting pieces and the mounting holes of the fan, the fastening portions resist against the mounting pieces, and the flanges resist against the side of the shell.

4. An air duct comprising:
a mounting bracket mounted to a fan; and
a plurality of guiding plates rotatably mounted to the mounting bracket;
wherein each guiding plate comprises a latching piece mounted to the guiding plate, and the mounting bracket defines a plurality of groups of positioning holes, with each group of positioning holes corresponding to the latching piece of each guiding plate, and the latching piece is selectively positioned by one of the corresponding group of positioning holes;
wherein the mounting bracket comprises two first lateral plates parallel to each other, and two second lateral plates connected between corresponding ends of the first lateral plates, the second lateral plates each define a plurality of pivot holes adjacent to the fan, two pivot pins extend from two opposite ends of each guiding plate to be respectively and rotatably mounted in corresponding two of the pivot holes of the second lateral plates;

wherein the positioning holes are defined in one of the second lateral plates, the latching piece is mounted to an end of each guiding plate, adjacent to the corresponding one of the groups of positioning holes, a positioning pin extends from the latching piece to be selectively positioned in one of the positioning holes of the corresponding group; and wherein each latching piece is elastic, an operation portion is formed at an extremity of the latching piece, a positioning portion is formed at a center of the latching piece, the positioning pin extends from the positioning portion.

5. An air duct comprising:

a mounting bracket comprising two opposite lateral plates, one of the lateral plates defining a plurality of groups of positioning holes;

a plurality of guiding plates rotatably mounted between the lateral plates of the mounting bracket with top sides like a shutter; and a plurality of latching pieces each mounted to a bottom side of a corresponding guiding plate, a positioning pin extending from each latching piece to be selectively engaged in one of a corresponding group of positioning holes;

wherein each latching piece is elastic, and comprises a first end mounted to the corresponding guiding plate, and a cantilevered second end, the positioning pin extends from a center of the latching piece towards the corresponding lateral plate.

6. The air duct of claim 5, wherein a substantially U-shaped positioning portion extends from the center of the latching piece towards the lateral plate, the positioning pin extends from the positioning portion.

7. The air duct of claim 5, wherein the lateral plates longitudinally define a plurality of pivot holes therein, each guiding plate comprises two pivot pins extending from opposite ends of the top side of the guiding plate, to respectively and rotatably engage in two corresponding pivot holes of the lateral plates.

* * * * *